(12) United States Patent
Kim

(10) Patent No.: US 9,692,424 B2
(45) Date of Patent: Jun. 27, 2017

(54) DECOUPLING CIRCUIT AND SEMICONDUCTOR DEVICE INCLUDING THE SAME

(71) Applicant: Samsung Electronics Co., Ltd., Suwon-si (KR)

(72) Inventor: Gil-Su Kim, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/847,076

(22) Filed: Sep. 8, 2015

(65) Prior Publication Data

US 2016/0197603 A1 Jul. 7, 2016

(30) Foreign Application Priority Data

Jan. 5, 2015 (KR) ........................ 10-2015-0000844

(51) Int. Cl.
*H03K 17/16* (2006.01)
*H03K 19/20* (2006.01)
*H03K 19/003* (2006.01)

(52) U.S. Cl.
CPC ....... *H03K 19/20* (2013.01); *H03K 19/00346* (2013.01)

(58) Field of Classification Search
CPC ..................................................... H03K 19/20
See application file for complete search history.

(56) References Cited

U.S. PATENT DOCUMENTS 5,506,457 A 4/1996 Krauter et al.
6,949,967 B2 9/2005 Wang et al.
7,342,434 B2 3/2008 Wakayama et al.
7,495,878 B2 2/2009 Todd
7,701,277 B2 4/2010 Toffolon et al.
8,493,075 B2 7/2013 Feng et al.
2007/0228840 A1 10/2007 Vikinski et al.
2010/0148304 A1 6/2010 Rahim et al.
2010/0308663 A1* 12/2010 Agarwal ................ G11C 29/02
307/99
2013/0043889 A1 2/2013 Guo et al.
2013/0242643 A1 9/2013 Kim et al.
2013/0256832 A1 10/2013 Yoo et al.

FOREIGN PATENT DOCUMENTS

JP 2013-118451 6/2013
KR 10-2004-0095888 11/2004
KR 10-2009-0064656 6/2009

\* cited by examiner

*Primary Examiner* — Daniel Puentes
(74) *Attorney, Agent, or Firm* — Muir Patent Law, PLLC

(57) ABSTRACT

A decoupling circuit and a semiconductor device including the same are provided. The decoupling circuit includes a first circuit including a first capacitor having a first end connected to a first terminal, a first switch device connected between a second end of the first capacitor and a second terminal, and a first control device configured to turn on/off the first switch device based on a voltage level of the a second end of the first capacitor, and a second circuit including a second capacitor having a first end connected to the first terminal, a second switch device connected between a second end of the second capacitor and the second terminal, and a second control device configured to turn on/off the second switch device based on a voltage level of the second end of the second capacitor and an output signal of the first control device.

12 Claims, 20 Drawing Sheets

1200

1300

1400

US 9,692,424 B2

DECOUPLING CIRCUIT AND SEMICONDUCTOR DEVICE INCLUDING THE SAME

CROSS-REFERENCE TO RELATED APPLICATION

This application claims priority under 35 U.S.C. §119 from Korean Patent Application No. 10-2015-0000844, filed Jan. 5, 2015, in the Korean Intellectual Property Office, the contents of which in its entirety are herein incorporated by reference.

BACKGROUND

The present disclosure relates to a decoupling circuit and a semiconductor device including the same.

Because of increases of an integration density and an operating speed of a semiconductor device, power noise generated in a chip may considerably affect the operation of the chip. In order to reduce the power noise, many kinds of decoupling devices, including decoupling capacitors, are being used. Accordingly, an area occupied by the decoupling devices is continuously increased in the chip.

Among decoupling devices, a decoupling capacitor may be connected between a power supply, for example, an external power voltage, and a ground voltage VSS, to reduce AC noise by short-circuiting an AC signal, while maintaining a DC signal. Here, capacitance of the decoupling capacitor is proportional to an area occupied by the capacitor. Minimizing power noise may be achieved by maximizing capacitance through increased use of cell type decoupling capacitors, which usually have the characteristics of large capacitance.

While using a 1-stage cell type capacitor may maximize capacitance per unit, the reliability may be lowered by an increase in the voltage difference applied to opposite ends of the capacitor. Thus, in a case of using a multi-stage cell type capacitor to enhance reliability, the overall capacitance may be reduced.

SUMMARY

According to certain aspects of the present disclosure, there is provided a decoupling circuit including a first circuit including a first capacitor having a first end connected to a first terminal, a first switch device connected between a second end of the first capacitor and a second terminal, and a first control device configured to turn on/off the first switch device based on a voltage level of the second end of the first capacitor, and a second circuit including a second capacitor having a first end connected to the first terminal, a second switch device connected between a second end of the second capacitor and the second terminal, and a second control device configured to turn on/off the second switch device based on a voltage level of the second end of the second capacitor and an output signal of the first control device.

According to certain aspects of the present disclosure, there is provided a decoupling circuit including a first circuit including a first capacitor and a first control device configured to turn on/off the first capacitor, and a second circuit including a second capacitor and a second control device configured to turn on/off the second capacitor, wherein if a time dependent dielectric breakdown (TDDB) is generated in the first capacitor, the first control device turns off the first capacitor and transfers a first signal for turning on the second capacitor to the second control device.

BRIEF DESCRIPTION OF THE DRAWINGS

The above and other features and advantages of the present disclosure will become more apparent by describing embodiments thereof with reference to the attached drawings in which.

Figure 1:
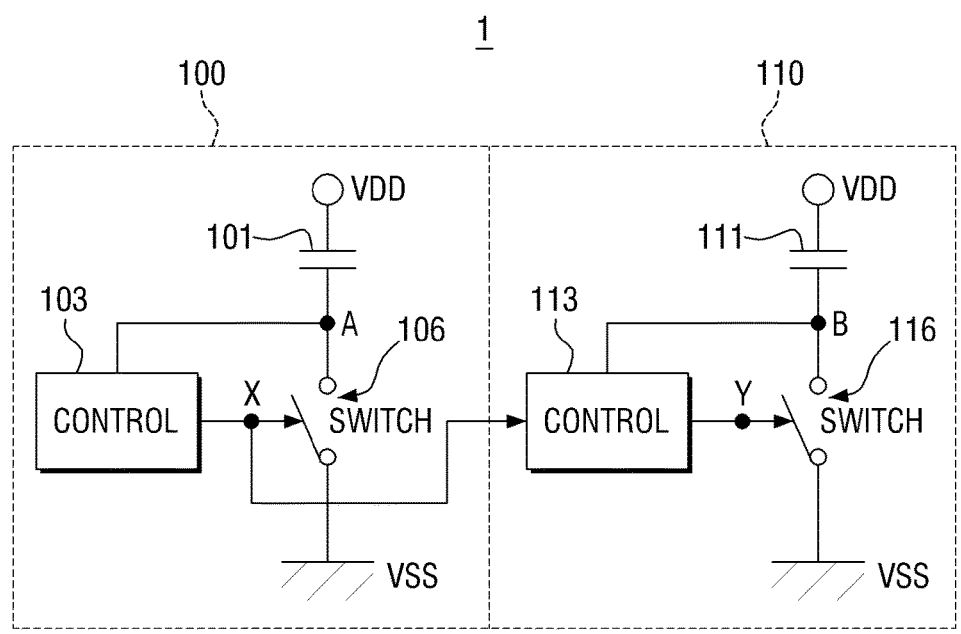
FIG. 1 is a block diagram of an example decoupling circuit according to certain embodiments.

Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

DETAILED DESCRIPTION

Advantages and features of the present disclosure and methods of accomplishing the same may be understood more readily by reference to the following detailed description of certain embodiments and the accompanying drawings. The present disclosure may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, or as "contacting" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of the present disclosure. In addition, in certain cases, even if a term is not described using "first," "second," etc. in the specification, it may still be referred to as "first" or "second" in a claim in order to distinguish difference claimed elements from each other.

As used herein, a semiconductor device may refer to any of the various devices such as shown in the attached figures such as FIGS. 1-14, and may also refer, for example, to one or more transistors, logic devices, or cell arrays, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera or other consumer electronic device, etc.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, decoupling circuits according to exemplary embodiments of the present disclosure and semiconductor devices including the same will be described with reference to FIGS. 1 to 20.

FIG. 1 is a block diagram of an example decoupling circuit according to certain embodiments.

Referring to FIG. 1, the decoupling circuit 1 according to certain embodiments of the present disclosure includes a first circuit 100 and a second circuit 110. Each of the first circuit 100 and the second circuit 110 may constitute a cell type capacitor.

The first circuit 100 may include a first capacitor 101, a first switch device 106, and a first control device 103.

One end of the first capacitor 101 may be connected to an external power voltage VDD and the other end thereof (i.e., node A) may be connected to the first switch device 106 and the first control device 103. The first capacitor 101 may reduce noise present between the external power voltage VDD and a ground voltage VSS in a semiconductor memory device. The first capacitor 101 is an electronic part capable of accumulating electricity and may be used in blocking DC current while passing AC current. The first capacitor 101 may be configured to include two electrodes narrowly spaced apart from each other and a dielectric provided between the two electrodes. The first capacitor 101 may include a fixed capacitor or a variable capacitor, but aspects of the present disclosure are not limited thereto.

The first switch device 106 may be connected between the ground voltage VSS and the first capacitor 101. The first switch device 106 may short or open electric circuits at opposite ends thereof. The first switch device 106 may be controlled by an output signal of the first control device 103. The first switch device 106 may include a p-channel metal oxide semiconductor (PMOS) transistor or an n-channel metal oxide semiconductor (NMOS) transistor, but aspects of the present disclosure are not limited thereto.

The first control device 103 may control the first switch device 106 according to electrical characteristics of the first capacitor 101. For example, the first control device 103 may turn on/off the first switch device 106 based on a voltage level of the other end of the first capacitor 101 (i.e., node A). The first control device 103 may determine the voltage level of the other end of the first capacitor 101 as a low level or a high level according to a predetermined reference level and may assign a logic value '0' or '1' accordingly. The first control device 103 may control the operation of the first switch device 106 using the output signal and may transfer the output signal to the second control device 113. The first control device 103 may include a NAND gate, an OR gate, or an inverter device, but aspects of the present disclosure are not limited thereto.

The second circuit 110 may include a second capacitor 111, a second switch device 116, and a second control device 113. The second circuit 110 may have substantially the same configuration as the first circuit 100, but aspects of the present disclosure are not limited thereto, and other example embodiments will be described.

In certain embodiments, one end of the second capacitor 111 may be connected to the external power voltage VDD and the other end thereof (i.e., node B) may be connected between the first switch device 106 and the first control device 103. The second switch device 116 may be connected between the ground voltage VSS and the second capacitor 111. The second switch device 116 may be controlled by an output signal of the second control device 113. The second switch device 116 may include a PMOS transistor or an NMOS transistor.

The second control device 113 may turn on/off the second switch device 116 based on a voltage level of the other end (i.e., node B) of the second capacitor 111. The second control device 113 may determine the voltage level of the other end (i.e., node B) of the second capacitor 111 as a low level or a high level according to a predetermined reference level and may assign a logic value '0' or '1' accordingly. The second control device 113 may control the operation of the second switch device 116 by transferring the output signal to the second switch device 116. The second control device 113 may include a NAND gate, an OR gate, or an inverter device.

If time dependent dielectric breakdown (TDDB) is not generated in the first capacitor 101, that is, before TDDB is generated, the first capacitor 101 may be electrically opened. In this case, the voltage level of the other end of the first capacitor 101 (i.e., node A) may be a low level. For example, if the voltage level of the node A has a logic value '0', the first control device 103 may output a signal capable of turning on the first switch device 106. Next, the first switch device 106 may connect the node A to the ground voltage VSS, thereby operating the first capacitor 101.

If TDDB is generated in the first capacitor 101, that is, after TDDB is generated, the first capacitor 101 may be electrically shorted. In this case, the voltage level of the other end of the first capacitor 101 may become approximate to the external power voltage VDD. For example, if the voltage level of the node A has a logic value '1', the first control device 103 may output a signal capable of turning off the first switch device 106. Next, the first switch device 106 turns off the first circuit 100, thereby disabling the first capacitor 101 having TDDB generated therein to be used. At the same time, the first control device 103 may transfer the output signal capable of operating the second switch device 116 to the second control device 113. The second control device 113 may turn on the second switch device 116, thereby operating the second capacitor 111, instead of the first capacitor 101.

The decoupling circuit 1 according to the present disclosure may include a plurality of cell type capacitors. If the cell type capacitors include a plurality of module units, the cell type capacitor having TDDB generated therein may be transferred into a disable mode without a separate process and a redundant cell capacitor, instead of the cell type capacitor having TDDB generated therein, may operate in an enable mode. In some embodiments, if TDDB is generated in the first capacitor 101 of the first circuit 100, the first control device 103 transfers a first signal for turning off the first switch device 106 and turning on the second switch device 116 to the second control device 113, thereby operating the second capacitor 111, instead of the first capacitor 101. Therefore, the second capacitor 111 operates as a redundant cell capacitor of the first capacitor 101. Accordingly, since the decoupling circuit 1 includes the second capacitor 111 operating when TDDB is generated in the first capacitor 101, reliability of conventional 1-stage cell type capacitors may be improved. In addition, since the second capacitor 111 operates as a redundant cell capacitor of the first capacitor 101, it may have larger capacitance than two or more capacitors connected in parallel to each other, while minimizing power noise.

Figure 2:
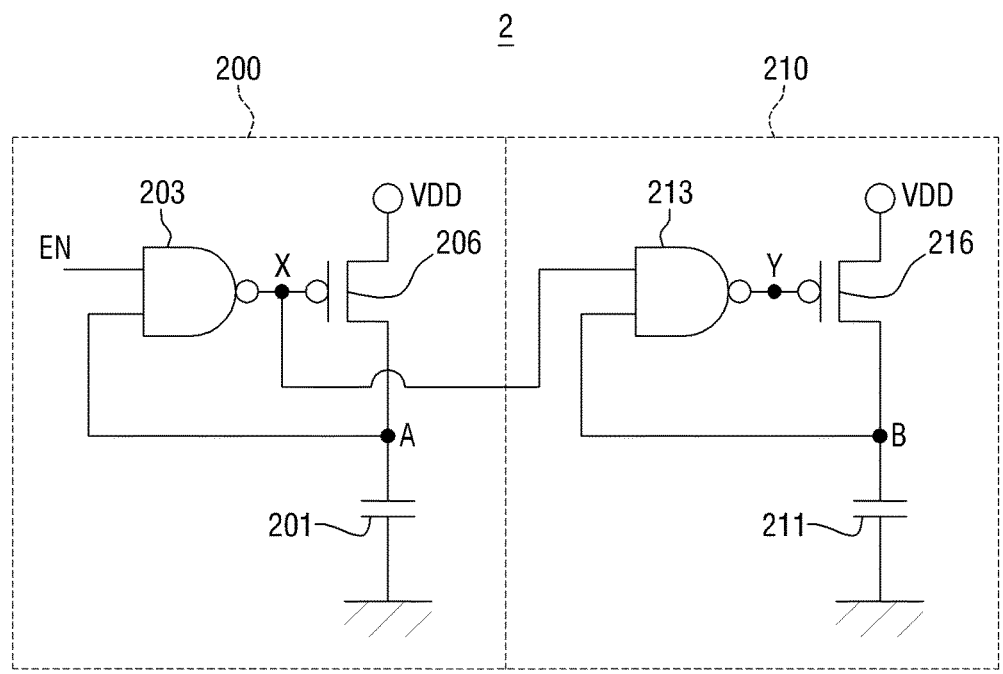
FIG. 2 is a block diagram of an example decoupling circuit according to certain embodiments.
Figure 3:
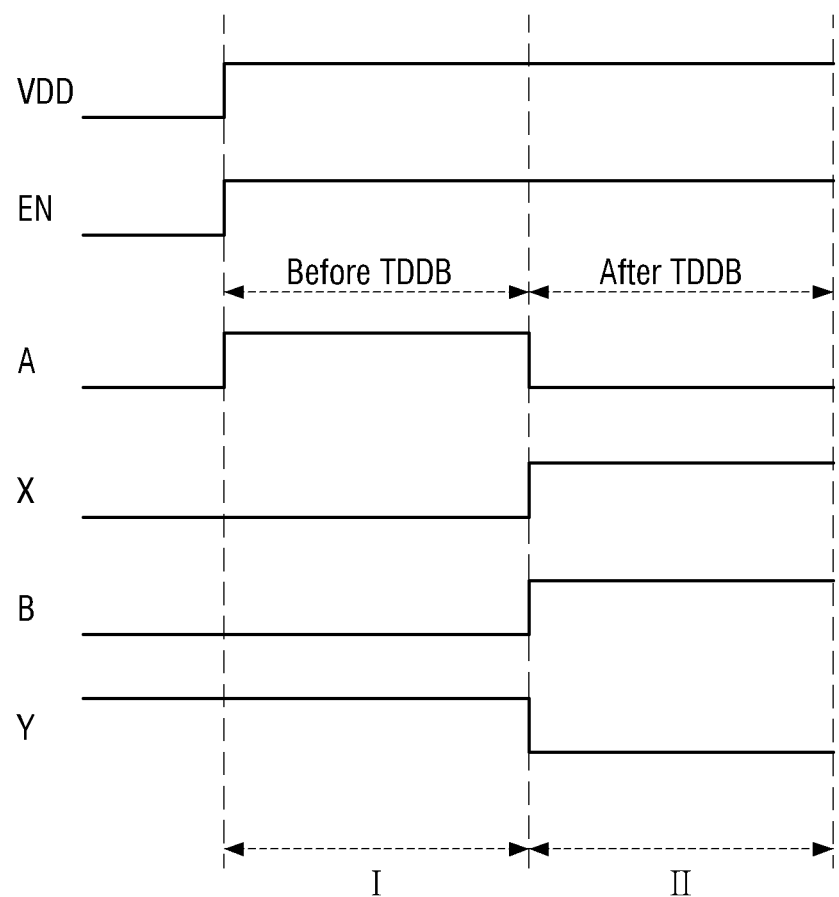
FIG. 3 is a timing diagram illustrating an example operation of the decoupling circuit according to certain embodiments.

FIG. 2 is a block diagram of an example decoupling circuit according to certain embodiments, and FIG. 3 is an example timing diagram illustrating an operation of the decoupling circuit according to certain embodiments.

Referring to FIGS. 2 and 3, the decoupling circuit 2 according to certain embodiments includes a first circuit 200 and a second circuit 210. The first circuit 200 may include a first capacitor 201, a first switch device 206, and a first control device 203, and the second circuit 210 may include a second capacitor 211, a second switch device 216, and a second control device 213. The second circuit 210 may be configured in substantially the same manner as the first circuit 200.

For example, the first switch device 206 may include a PMOS transistor, and the first control device 203 may include a NAND gate. One end of the first capacitor 201 may be connected to a ground voltage VSS, and the other end thereof may be connected to the first switch device 206 and the first control device 203.

The first switch device 206 may be connected between an external power voltage VDD and the first capacitor 201. The first switch device 206 may short or open electric circuits of opposite ends of the first switch device 206. The first switch device 206 may be controlled by an output signal of the first control device 203. If the output signal of the first control device 203 has a logic value '0', the electric circuits of the first switch device 206 may be shorted. If the output signal of the first control device 203 has a logic value '1', the electric circuits of the first switch device 206 may be opened.

The second switch device 216 may include a PMOS transistor and the second control device 213 may include a NAND gate. One end of the second capacitor 211 may be connected to a ground voltage VSS, and the other end thereof may be connected to the second switch device 216 and the second control device 213.

The second switch device 216 may be connected between the ground voltage VSS and the second capacitor 211. The second switch device 216 may short or open electric circuits of opposite ends of the second switch device 216. The second switch device 216 may be controlled by an output signal of the second control device 213. If the output signal of the second control device 213 has a logic value '0', the electric circuits of the second switch device 216 are shorted. If the output signal of the second control device 213 has a logic value '1', the electric circuits of the second switch device 216 are opened.

The first control device 203 may receive an enable signal (EN) as an input. The first control device 203 may turn on/off the first switch device 206 based on a voltage level of the other end of the first capacitor 201 (i.e., node A) and the enable signal. In some embodiments, in a first period I of FIG. 3, if TDDB is generated in the first capacitor 201, the first capacitor 201 may be electrically opened. In this case, the voltage level of the node A may be a high level. For example, the voltage level of the node A may have a logic value '1', and the first control device 203 may output a signal capable of turning on the first switch device 206 (e.g., a signal having a logic value '0') to a node X.

However, in a second period II of FIG. 3, if TDDB is generated in the first capacitor 201, the first capacitor 201 may be electrically shorted. Here, resistance of the first capacitor 201 may be smaller than that of the first switch device 206, and the voltage level of the other end of the first capacitor 201 (i.e., node A) may be lower than the voltage before TDDB is generated in the first capacitor 201. In this case, the voltage level of the node A may be a low level. For example, the voltage level of the node A may have a logic value '0' and the first control device 203 may output a signal capable of turning off the first switch device 206 (e.g., a signal having a logic value '1') to the node X.

The second control device 213 may receive the output signal of the first control device 203 as an input. The second control device 213 may turn on/off the second switch device 216 based on a voltage level of the other end of the second capacitor 211 (i.e., node B) and the output signal of the first control device 203. For example, in a first period I of FIG. 3, if TDDB is not generated in the first capacitor 201, the output signal of the first control device 203 may have a logic value '0', and the second control device 213 may output a signal capable of turning off the second switch device 216 (e.g., a signal having a logic value '1') to a node Y.

Conversely, if TDDB is generated in the first capacitor 201, the output signal of the first control device 203 may have a logic value '1', and the second control device 213 may output a signal capable of turning on the second switch device 216 (e.g., a signal having a logic value '0'). Here, since the second capacitor 211 normally operates, it may be electrically opened. In this case, a voltage level of the node B may be a high level. For example, the voltage level of the node B may have a logic level '1'.

To sum up, if TDDB is generated in the first capacitor 201, the first capacitor 201 may be electrically shorted. The node A may have a ground voltage VSS and the first control device 203 may generate a signal capable of turning off the first switch device 206 using the ground voltage VSS (that is, node X=VDD), thereby disabling use of the cell type capacitor having TDDB generated therein (i.e., the first circuit 200), while controlling the other cell type capacitor (i.e., the second circuit 210) to operate in an enable mode.

Conversely, if TDDB is not generated in the first capacitor 201, the first capacitor 201 may be electrically opened and the first switch device 206 may generate a signal capable of turning on the first control device 203 (that is, node X=VSS), thereby allowing use of the cell type capacitor (i.e., the first circuit 200), while controlling the other cell type capacitor (i.e., the second circuit 210) to operate in a disable mode.

Accordingly, since the decoupling circuit 2 according to some embodiments of the present disclosure includes the second capacitor 211 operating when TDDB is generated in the first capacitor 101, reliability of conventional 1-stage cell type capacitors may be improved. In addition, since the second capacitor 111 operates as a redundant cell capacitor of the first capacitor 101, it may have larger capacitance than two or more capacitors connected in parallel to each other, while minimizing power noise.

Figure 4:
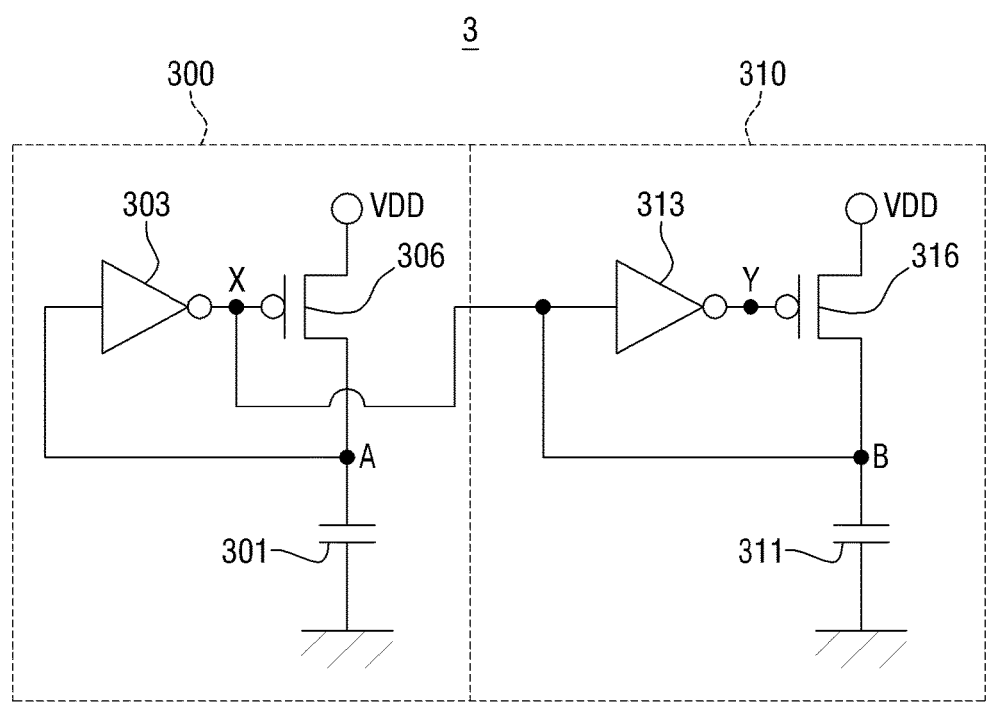
FIG. 4 is a block diagram of an example decoupling circuit according to certain embodiments.
Figure 5:
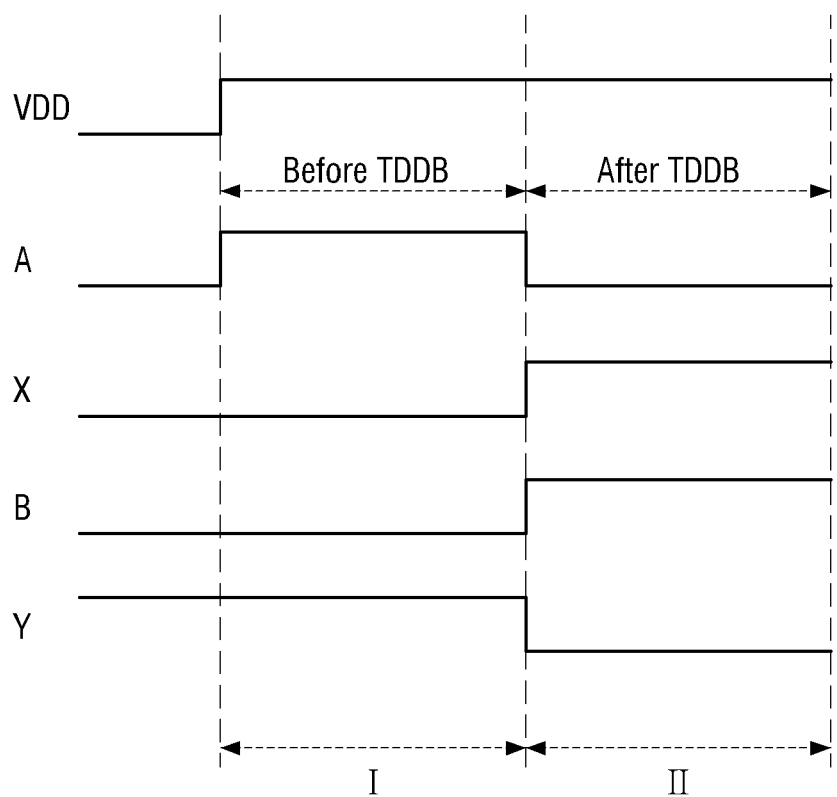
FIG. 5 is a timing diagram illustrating an example operation of the decoupling circuit according to certain embodiments.

FIG. 4 is a block diagram of an example decoupling circuit according to certain embodiments of the present disclosure, and FIG. 5 is an example timing diagram illustrating an operation of the decoupling circuit according to certain embodiments. For brevity, substantially the same explanation with the previous embodiment will be omitted and the following description will focus on differences between the present and previous embodiments.

Referring to FIGS. 4 and 5, the decoupling circuit 3 according to certain embodiments of the present disclosure includes a first circuit 300 and a second circuit 310. The first circuit 300 may include a first capacitor 301, a first switch device 306, and a first control device 303, and the second circuit 310 may be configured in substantially the same manner as the first circuit 300. In addition, the decoupling circuit 3 according to some embodiments of the present disclosure may operate in substantially the same manner as the decoupling circuit 2 according to some embodiments shown in FIGS. 2 and 3.

For example, the first switch device 306 may include a PMOS transistor, and the first control device 303 may include an inverter device. One end of the first capacitor 301 may be connected to a ground voltage VSS and the other end thereof may be connected to the first switch device 306 and the first control device 303.

The first switch device 306 may be connected between an external power voltage VDD and the first capacitor 301. The first switch device 306 may short or open electric circuits of opposite ends of the first switch device 306. The first switch device 306 may be controlled by an output signal of the first control device 303.

The second switch device 316 may include a PMOS transistor, and the second control device 313 may include an inverter device. One end of the second capacitor 311 may be connected to the ground voltage VSS and the other end thereof may be connected to the second switch device 316 and the second control device 313. The second switch device 316 may be connected between the external power voltage VDD and the second capacitor 311. The second switch device 316 may be controlled by an output signal of the second control device 313.

The first control device 303 may turn on/off the first switch device 306 based on a voltage level of the other end of the first capacitor 301 (i.e., node A). For example, in the first period I of FIG. 5, if TDDB is not generated in the first capacitor 301, the first capacitor 301 may be electrically opened. In this case, the voltage level of the node A may be a high level. For example, the voltage level of the node A of the first capacitor 301 may have a logic value '1', and the first control device 303 may output a signal capable of turning on the first switch device 306 (e.g., a signal having a logic value '0') to a node X.

Conversely, in a second period II of FIG. 5, if TDDB is generated in the first capacitor 301, that is, after TDDB is generated, the first capacitor 301 may be electrically shorted. In this case, the voltage level of the node A may be a low level. For example, the voltage level of the node A may have a logic value '0', and the first control device 303 may output a signal capable of turning off the first switch device 306 (e.g., a signal having a logic value '1') to the node X.

The second control device 313 may receive the output signal of the first control device 303 as an input. The second control device 313 may turn on/off the second switch device 316 based on a voltage level of the other end of the second capacitor 311 (i.e., node B) and the output signal of the first control device 303. In some embodiments, in the first period I of FIG. 5, if TDDB is not generated in the first capacitor 301, the output signal of the first control device 303 may have a logic value '0' and the second control device 313 may output a signal capable of turning off the second switch device 316 (e.g., a signal having a logic value '1').

Conversely, if TDDB is generated in the first capacitor 301, the output signal of the first control device 303 may have a logic value '1' and the second control device 313 may output a signal capable of turning on the second switch device 316 (e.g., a signal having a logic value '0').

To sum up, if TDDB is generated in the first capacitor 301, the first capacitor 301 may be electrically shorted. The node A may have a ground voltage VSS and the first control device 303 may generate a signal capable of turning off the first switch device 306 using the ground voltage VSS (that is, node X=VDD), thereby disabling the cell type capacitor having TDDB generated therein (i.e., the first circuit 300) to be used, while controlling the other cell type capacitor (i.e., the second circuit 310) to operate in an enable mode.

Conversely, if TDDB is not generated in the first capacitor 301, the first capacitor 201 may be electrically opened and the first switch device 306 may generate a signal capable of turning on the first control device 303 (that is, node X=VSS), thereby allowing the cell type capacitor (i.e., the first circuit 300) to be used, while controlling the other cell type capacitor (i.e., the second circuit 310) to operate in a disable mode.

Figure 6:
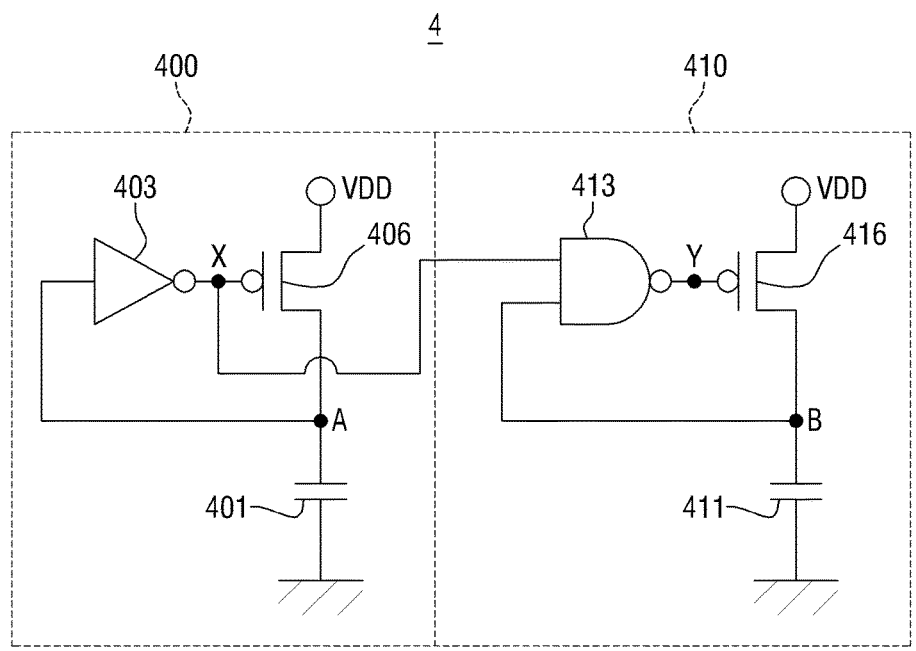
FIG. 6 is a block diagram of an example decoupling circuit according to certain embodiments.
Figure 7:
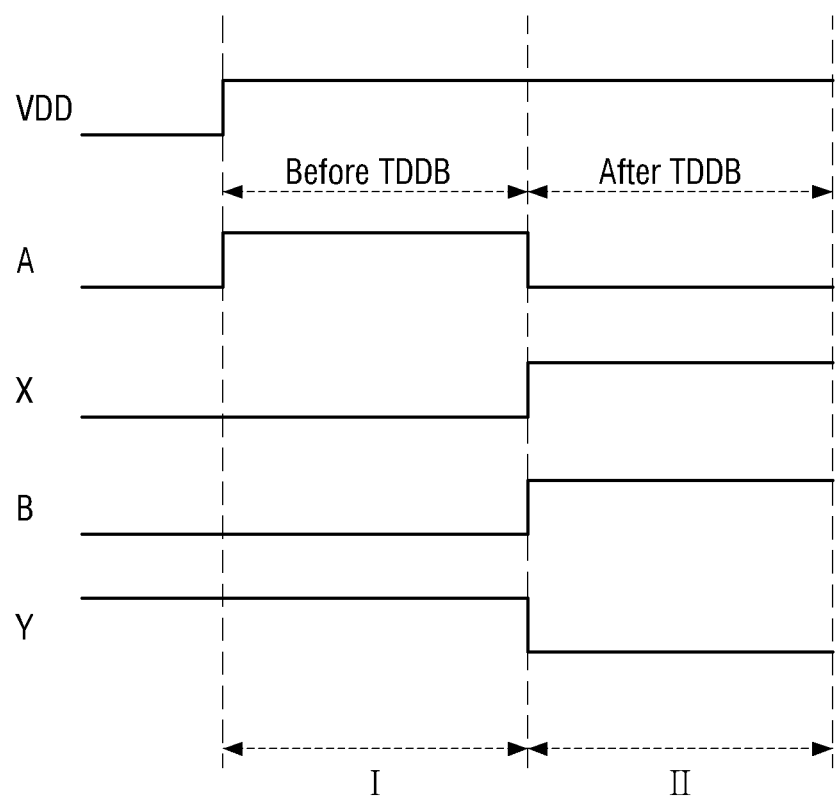
FIG. 7 is a timing diagram illustrating an example operation of the decoupling circuit according to certain embodiments.

FIG. 6 is a block diagram of an example decoupling circuit according to certain embodiments, and FIG. 7 is an example timing diagram illustrating an operation of the decoupling circuit according to certain embodiments. For brevity, substantially the same explanation with the previous embodiment will be omitted and the following description will focus on differences between the present and previous embodiments.

Referring to FIGS. 6 and 7, the decoupling circuit 4 according to certain embodiments of the present disclosure includes a first circuit 400 and a second circuit 410. The first circuit 400 may include a first capacitor 401, a first switch device 406, and a first control device 403, and the second circuit 410 may include a second capacitor 411, a second switch device 416, and a second control device 413. The first control device 403 may include different types of devices from the second control device 413.

In some embodiments, the first switch device 406 may include a PMOS transistor, and the first control device 403 may include an inverter device. One end of the first capacitor 401 may be connected to a ground voltage VSS and the other end thereof may be connected to the first switch device 406 and the first control device 403.

The first switch device 406 may be connected between an external power voltage VDD and the first capacitor 401. The first switch device 406 may short or open electric circuits of opposite ends of the first switch device 406. The first switch device 406 may be controlled by an output signal of the first control device 403.

The second switch device 416 may include a PMOS transistor, and the second control device 413 may include a NAND gate. One end of the second capacitor 411 may be connected to the ground voltage VSS and the other end thereof may be connected to the second switch device 416 and the second control device 413. The second switch device 416 may be connected between the external power voltage VDD and the second capacitor 411. The second switch device 416 may be controlled by an output signal of the second control device 413.

The first control device 403 may turn on/off the first switch device 406 based on a voltage level of the other end of the first capacitor 401 (i.e., node A). In some embodiments, in a first period I of FIG. 7, if TDDB is not generated in the first capacitor 401, the first capacitor 401 may be electrically opened. In this case, the voltage level of the node A may be a high level. For example, the voltage level of the node A may have a logic value '1', and the first control device 403 may output a signal capable of turning on the first switch device 406 (e.g., a signal having a logic value '0') to a node X.

Conversely, in a second period II of FIG. 7, if TDDB is generated in the first capacitor 401, the first capacitor 401 may be electrically shorted. In this case, the voltage level of the node A may be a low level. For example, the voltage level of the node A may have a logic value '0', and the first control device 403 may output a signal capable of turning off the first switch device 406 (e.g., a signal having a logic value '1') to the node X.

The second control device 413 may turn on/off the second switch device 416 based on a voltage level of the other end of the second capacitor 411 (i.e., node B) and the output signal of the first control device 403. For example, in the first period I of FIG. 7, if TDDB is not generated in the first capacitor 401, the output signal of the first control device 403 may have a logic value '0' and the second control device 413 may output a signal capable of turning off the second switch device 416 (e.g., a signal having a logic value '1').

The decoupling circuit 4 according to some embodiments may operate in substantially the same manner as the decoupling circuit 2 according to some embodiments of the present disclosure shown in FIGS. 2 and 3.

Figure 8:
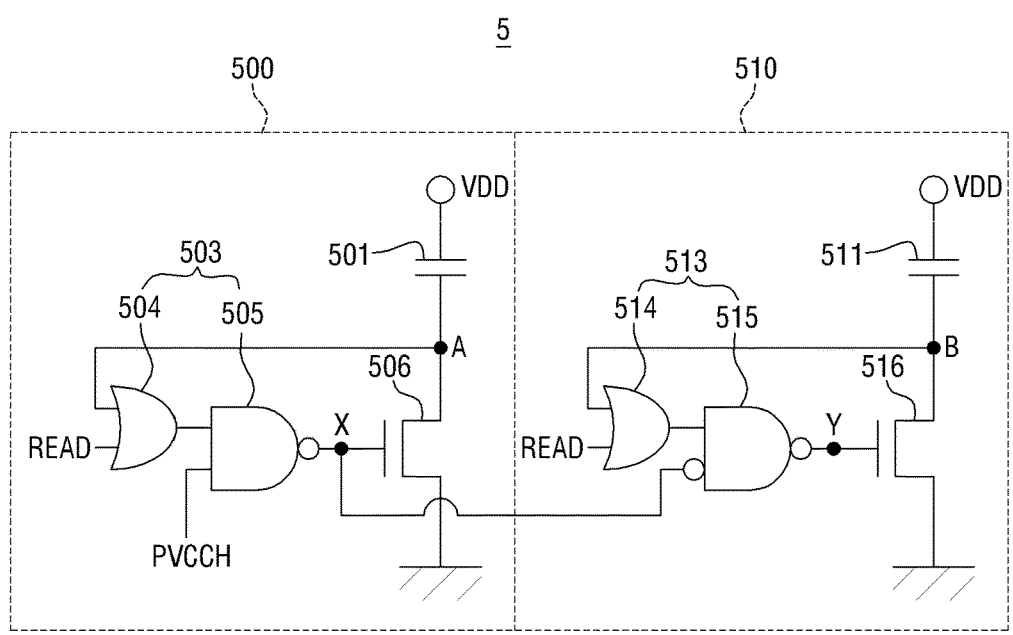
FIG. 8 is a block diagram of an example decoupling circuit according to certain embodiments.
Figure 9:
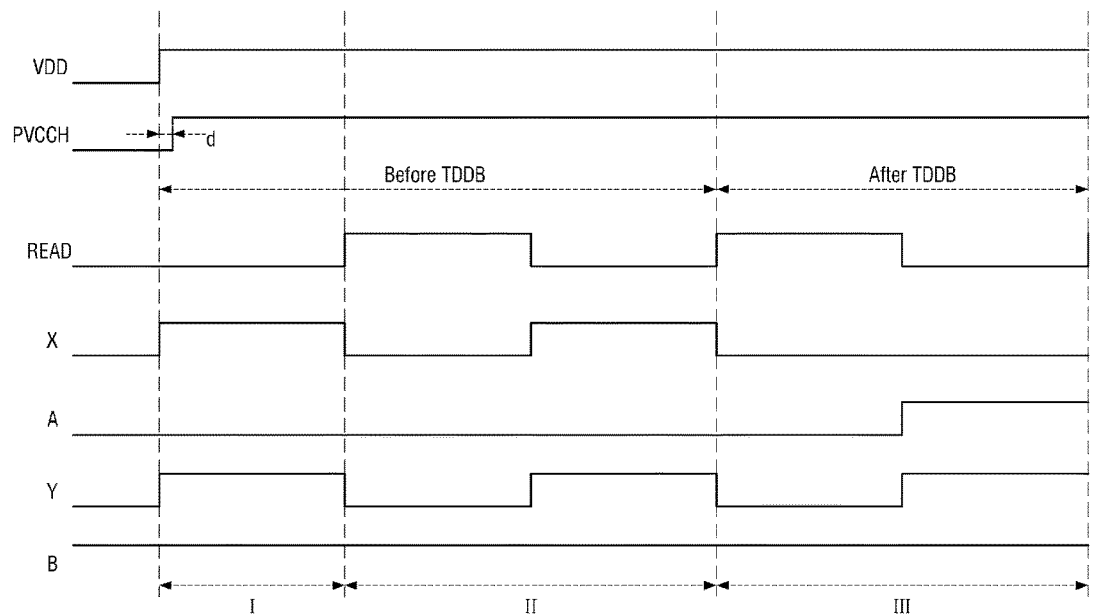
FIG. 9 is a timing diagram illustrating an example operation of the decoupling circuit according to certain embodiments.

FIG. 8 is an example block diagram of a decoupling circuit according to certain embodiments, and FIG. 9 is an example timing diagram illustrating an operation of the decoupling circuit according to certain embodiments. For brevity, substantially the same content with the previous embodiment will be omitted and the following description will focus on differences between the present and previous embodiments.

Referring to FIGS. 8 and 9, the decoupling circuit 5 according to certain embodiments of the present disclosure may include a first circuit 500 and a second circuit 510. The first circuit 500 may include a first capacitor 501, a first switch device 506, and a first control device 503, and the second circuit 510 may include a second capacitor 511, a second switch device 516, and a second control device 513. The second circuit 510 may be configured in substantially the same manner as the first circuit 500.

In some embodiments, the first switch device 506 may include an NMOS transistor, and the first control device 503 may include a first OR gate 504 and a first NAND gate 514. One end of the first capacitor 501 may be connected to an external power voltage VDD, and the other end thereof may be connected to the first switch device 506 and the first control device 503.

The first switch device 506 may be connected between a ground voltage VSS and the first capacitor 501. The first switch device 506 may be controlled by an output signal of the first control device 503.

The second switch device 516 may include an NMOS transistor, and the second control device 513 may include a second OR gate 514 and a second NAND gate 515. One end of the second capacitor 511 may be connected to the external power voltage VDD and the other end thereof may be connected to the second switch device 516 and the second control device 513.

The second switch device 516 may be connected between the ground voltage VSS and the second capacitor 511. The second switch device 516 may be controlled by an output signal of the second control device 513.

The first control device 503 may receive a read signal (READ) as an input. The read signal READ may be a signal for testing whether TDDB is generated in the first circuit 500 or not, which will be described further.

The first OR gate 504 may transfer the output signal to the first NAND gate 505 based on a voltage level of the other end A of the first capacitor 501 and the read signal READ. The first NAND gate 505 may turn on/off the first switch device 506 based on an initialization signal (PVCCH) and the output signal of the first OR gate 504.

In some embodiments, in a first period I of FIG. 9, VDD and PVCCH may be applied and the first switch device 506 and the second switch device 516 may be in an ON state, so that a predetermined voltage may be applied to charge the first capacitor 501 and the second capacitor 511. For example, the first capacitor 501 and the second capacitor 511 may be initialized. Here, PVCCH and VDD may be applied simultaneously or sequentially, but aspects of the present disclosure are not limited thereto.

In a second period II of FIG. 9, if TDDB is not generated in the first capacitor 501, the first capacitor 501 may be electrically opened after the read signal READ is turned off. In this case, the voltage level of the node A may be maintained at a low level. For example, the voltage level of the node A may have a logic value '0', and the first NAND gate 514 may output a signal capable of turning on the first switch device 506 (e.g., a signal having a logic value '1').

Conversely, in a third period III of FIG. 9, if TDDB is generated in the first capacitor 501, the first capacitor 501 may be electrically shorted after the read signal READ is turned off. Here, resistance of the first capacitor 501 may be smaller than that of the first switch device 506 and the voltage level of the node A of the first capacitor 501 may be lower than that before TDDB is generated in the first capacitor 501. In this case, the voltage level of the node A may be activated from a low level to a high level. For example, the voltage level of the node A may be changed from logic value '0' to logic value '1', and the first NAND gate 514 may continuously output a signal capable of turning off the first switch device 506 (e.g., a signal having a logic value '1').

Here, if the read signal READ is turned on, the first switch device 506 may be always in an opened state. Next, in a case where the read signal READ is turned off, if TDDB is not generated, the first switch device 506 may turn into a shorted state, and if TDDB is generated, the first switch device 506 may be maintained in the opened state. For example, the read signal READ may be used to check whether TDDB is generated in the first capacitor 501 or not. The read signal READ may be periodically generated by a predetermined period signal, but aspects of the present disclosure are not limited thereto.

The second OR gate 514 may receive a voltage level of the other end B of the second capacitor 511 and the read signal READ as inputs. The second NAND gate 515 may receive an inverted output signal of the first control device 503 as an input. The second NAND gate 515 may turn on/off the second switch device 516 based on an output signal of the second OR gate 514 and the inverted output signal of the first control device 503. In some embodiments, in a second period II of FIG. 9, if TDDB is not generated in the first capacitor 501, the output signal of the first NAND gate 514 may have a logic value '1' after the read signal READ is turned off, and the second control device 513 may output a signal capable of turning on the second switch device 516 (e.g., a signal having a logic value '1').

Conversely, if TDDB is generated in the first capacitor 501, the output signal of the first NAND gate 514 may have a logic value '0' after the read signal READ is turned off, and the second control device 513 may output a signal capable of turning on the second switch device 516 (e.g., a signal having a logic value '1'). Here, since the second capacitor 511 normally operates, it may be electrically opened. In this case, the voltage level of the node B may be a high level. For example, the voltage level of the node B may have a logic level '1'.

To sum up, if TDDB is not generated in the first capacitor 501, the voltage level of the node A may be maintained, and if TDDB is generated in the first capacitor 501, the voltage level of the node A may increase.

In addition, if TDDB is generated in the first capacitor 501, the first capacitor 501 may be electrically shorted. The node A may have a VDD voltage and the first control device 503 may generate a signal capable of turning off the first switch device 506 using VDD voltage (e.g., a signal having a logic value '0'), thereby disabling use of the cell type capacitor having TDDB generated therein (i.e., the first circuit 500), while controlling the other cell type capacitor (i.e., the second circuit 510) to operate in an enable mode.

However, in the decoupling circuit 5 according to some embodiments, the second capacitor 511 may operate not only in a case where TDDB is generated in the first capacitor 501 but also in a case where TDDB is not generated in the first capacitor 501, but aspects of the present disclosure are not limited thereto.

Accordingly, since the decoupling circuit 5 according to some embodiments of the present disclosure includes the second capacitor 511 operating when TDDB is generated in the first capacitor 501, reliability of the conventional 1-stage cell type capacitors may be improved. In addition, since the second capacitor 511 operates as a redundant cell capacitor of the first capacitor 501, it may have larger capacitance than two or more capacitors connected in parallel to each other, while minimizing power noise.

Figure 10:
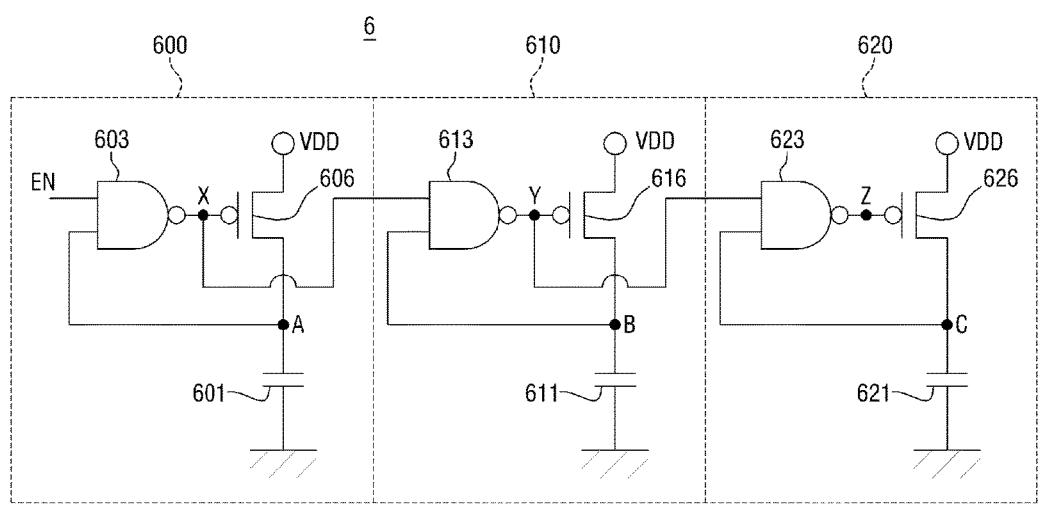
FIG. 10 is a block diagram of an example decoupling circuit according to certain embodiments.
Figure 11:
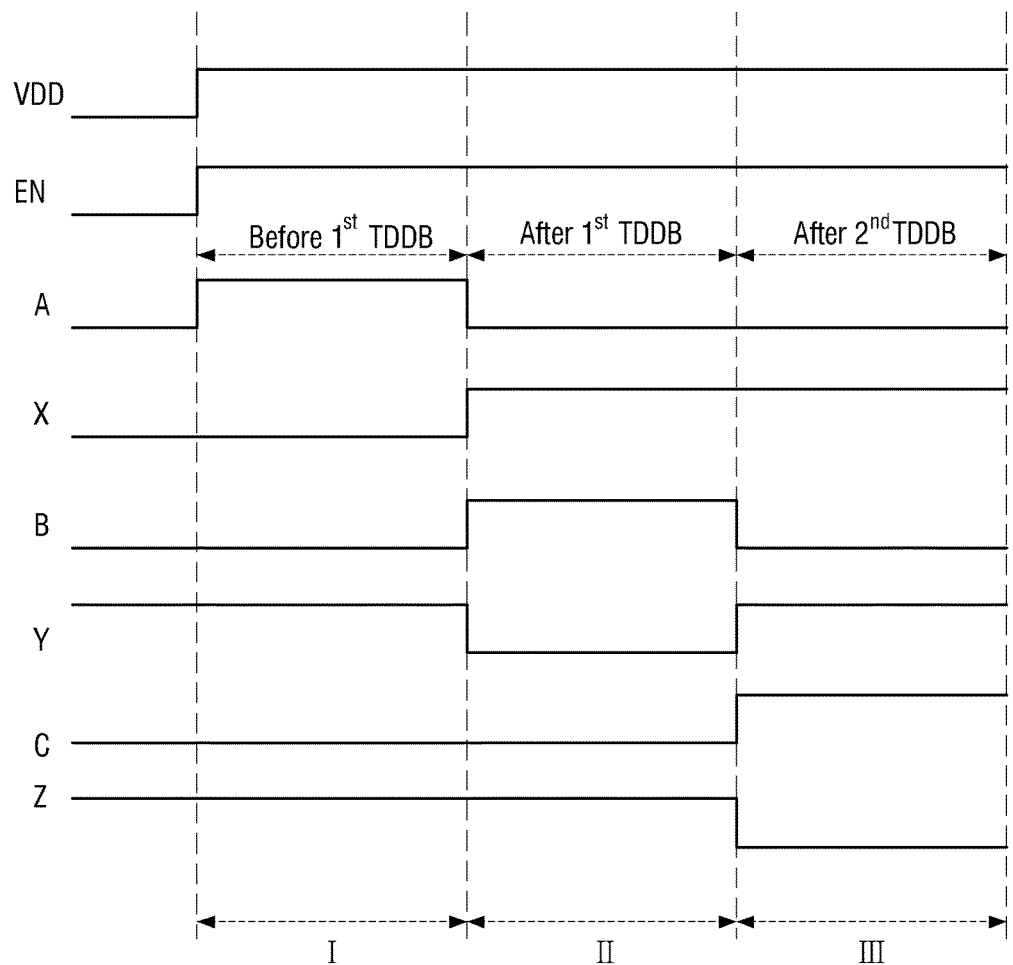
FIG. 11 is a timing diagram illustrating an example operation of the decoupling circuit according to certain embodiments.

FIG. 10 is an example block diagram of a decoupling circuit according to certain embodiments, and FIG. 11 is an example timing diagram illustrating an operation of the decoupling circuit according to certain embodiments. For brief and convenient explanation, substantially the same explanation with the previous embodiment will be omitted and the following description will focus on differences between the present and previous embodiments.

Referring to FIGS. 10 and 11, the decoupling circuit 6 according to certain embodiments includes a first circuit 600, a second circuit 610 and a third circuit 620. The first circuit 600 may include a first capacitor 601, a first switch device 606, and a first control device 603. The second circuit 610 may include a second capacitor 611, a second switch device 616, and a second control device 613. In addition, the third circuit 620 may include a third capacitor 621, a third switch device 623, and a third control device 626. In addition, the decoupling circuit 6 according to some embodiments of the present disclosure may operate in substantially the same manner as the decoupling circuit 2 according to some embodiments of the present disclosure shown in FIGS. 2 and 3. However, the decoupling circuit 6 according to some embodiments may further include an additional redundant cell capacitor.

In some embodiments, the first switch device 606 may include a PMOS transistor, and the first control device 603 may include a NAND gate. One end of the first capacitor 601 may be connected to a ground voltage VSS and the other end thereof may be connected to the first switch device 606 and the first control device 603. The first switch device 606 may be connected between an external power voltage VDD and the first capacitor 601. The first switch device 606 may be controlled by an output signal of the first control device 603.

The second switch device 616 may include a PMOS transistor and the second control device 613 may include a NAND gate. One end of the second capacitor 611 may be connected to the ground voltage VSS and the other end thereof may be connected to the second switch device 616 and the second control device 613. The second switch device 616 may be connected between the external power voltage VDD and the second capacitor 611. The second switch device 616 may be controlled by an output signal of the second control device 613.

Likewise, the third switch device 623 may include a PMOS transistor and the third control device 623 may include a NAND gate. One end of the third capacitor 621 may be connected to the ground voltage VSS and the other end thereof may be connected to the third switch device 626 and the third control device 623. The third switch device 626 may be connected between the external power voltage VDD and the third capacitor 621. The third switch device 626 may be controlled by an output signal of the third control device 623.

The first control device 603 may turn on/off the first switch device 606 based on a voltage level of the other end of the first capacitor 601 (i.e., node A). In some embodiments, in a first period I of FIG. 11, if TDDB is not generated in the first capacitor 601, the first capacitor 601 may be electrically opened. In this case, the voltage level of the node A may be a high level. For example, the voltage level of the node A may have a logic value '1', and the first control device 603 may output a signal capable of turning on the first switch device 606 (e.g., a signal having a logic value '0') to a node X.

Conversely, in a second period II of FIG. 11, if TDDB is generated in the first capacitor 601, the first capacitor 601 may be electrically shorted. In this case, the voltage level of the node A may be a low level. For example, the voltage level of the node A may have a logic value '0', and the first control device 603 may output a signal capable of turning off the first switch device 606 (e.g., a signal having a logic value '1') to the node X.

The second control device 613 may receive the output signal of the first control device 603 as an input. The second control device 613 may turn on/off the second switch device 616 based on a voltage level of the other end of the second capacitor 611 (i.e., node B) and the output signal of the first control device 603. In some embodiments, in the first period I of FIG. 11, if TDDB is not generated in the first capacitor 601, the output signal of the first control device 603 may have a logic value '0', and the second control device 613 may output a signal capable of turning off the second switch device 616 (e.g., a signal having a logic value '1') to a node Y.

Conversely, in the second period II of FIG. 11, if TDDB is generated in the first capacitor 601, the output signal of the first control device 603 may have a logic value '1', and the second control device 613 may output a signal capable of turning on the second switch device 616 (e.g., a signal having a logic value '0') to the node Y.

Additionally, in a third period III of FIG. 11, if TDDB is generated in the second capacitor 611, the second capacitor 611 may be electrically shorted. In this case, a voltage level of the node B may be a low level. For example, the voltage level of the node B may have a logic level '0', and the second control device 613 may output a signal capable of turning off the second switch device 616 (e.g., a signal having a logic value '1') to the node Y.

Here, the third control device 623 may receive the output signal of the second control device 613 as an input. The third control device 623 may turn on/off the third switch device 626 based on a voltage level of the other end of the third capacitor 621 (i.e., node C) and the output signal of the second control device 613. In some embodiments, in the second period II of FIG. 11, if TDDB is not generated in the second capacitor 611, the output signal of the second control device 613 may have a logic value '0', and the third control device 623 may output a signal capable of turning off the third switch device 626 (e.g., a signal having a logic value '1') to a node Z.

Conversely, in the third period III of FIG. 11, if TDDB is generated in the second capacitor 611, the output signal of the second control device 613 may have a logic value '1', and the third control device 623 may output a signal capable of turning on the third switch device 626 (e.g., a signal having a logic value '0') to the node Z.

To sum up, if TDDB is generated in the first capacitor 601, the first control device 603 may turn off the first switch device 606 and may transfer the signal to the second control device 613 to turn on the second switch device 616 to allow the second capacitor 611 to operate. Accordingly, the second capacitor 611 may function as a redundant cell capacitor of the first capacitor 601.

However, if TDDB is generated in the second capacitor 611, the second control device 613 may turn off the second switch device 616 and may transfer the signal to the third control device 623 to turn on the third switch device 626 to allow the third capacitor 621, instead of the second capacitor 611, to operate. Accordingly, the third capacitor 621 may function as a redundant cell capacitor of the second capacitor 611.

Accordingly, the decoupling circuit 6 according to some embodiments of the present disclosure may improve reliability of conventional 1-stage cell type capacitors. In addition, the decoupling circuit 6 may maximize capacitance, while minimizing power noise. In the decoupling circuit 6 according to some embodiments of the present disclosure, the first to third control devices 603, 613, and 623 including NAND gates are illustrated, but aspects of the present disclosure are not limited thereto. The first to third control devices 603, 613, and 623 may include OR gates or inverter devices.

Figure 12:
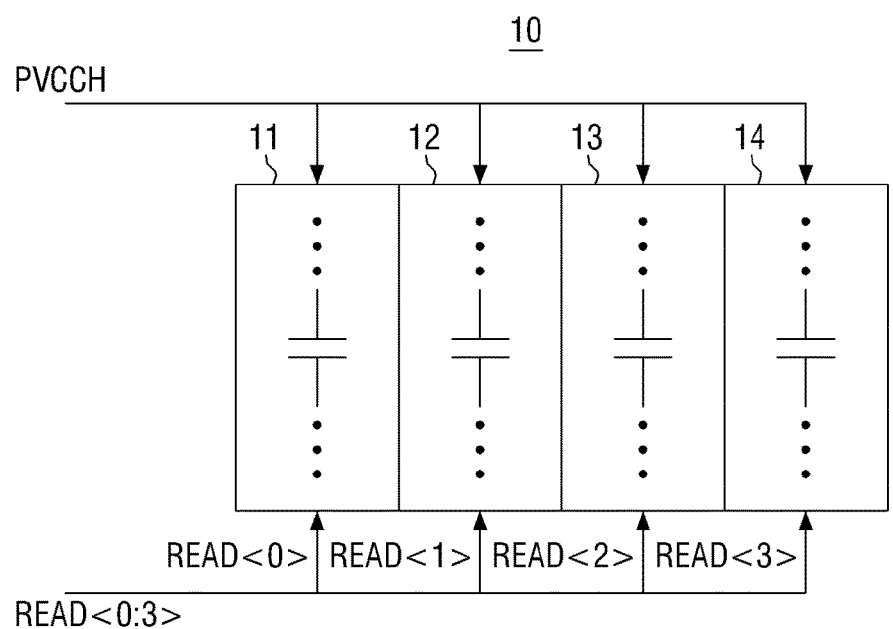
FIG. 12 is a block diagram of a semiconductor device including a decoupling circuit according to exemplary embodiments.
Figure 13:
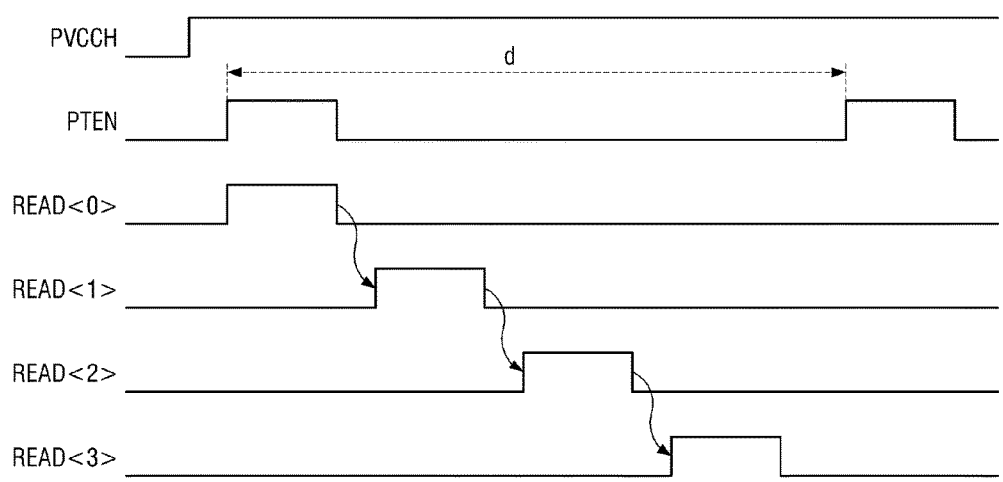
FIG. 13 is a timing diagram illustrating an operation of the semiconductor device including a decoupling circuit according to exemplary embodiments.

FIG. 12 is an example block diagram of a semiconductor device including a decoupling circuit according to exemplary embodiments of the present disclosure, and FIG. 13 is an example timing diagram illustrating an operation of the semiconductor device including a decoupling circuit according to certain exemplary embodiments.

For brevity, substantially the same content with the previous embodiment will be omitted and the following description will focus on differences between the present and previous embodiments.

Referring to FIGS. 12 and 13, the semiconductor device 10 according to exemplary embodiments of the present disclosure may include one of the above-described decoupling circuits 1 to 6. In some embodiments, the semiconductor device 10 may include a plurality of decoupling circuits 11 to 14, and each of the decoupling circuits 11 to 14 may be configured and may operate in substantially the same manner as the above-described decoupling circuits 1 to 6, but aspects of the present disclosure are not limited thereto. In the following description, the semiconductor device 10 will be described in a manner such that each of the decoupling circuits 11 to 14 is substantially similar to the decoupling circuit 5 shown in FIGS. 8 and 9.

The respective decoupling circuits 11 to 14 may be connected in parallel to one another. The same initialization signal PVCCH may be applied to the respective decoupling circuits 11 to 14. In addition, each of read signals READ<0:3> may be applied to each of the decoupling circuits 11 to 14. Throughout, the expression "read signal being applied to a decoupling circuit" may mean that a signal that may turn on and then turning off the read signal is applied to each decoupling circuit.

The read signals READ<0:3> may be sequentially applied to the plurality of decoupling circuits 11 to 14, respectively. For example, referring to FIG. 13, a first read signal READ<0> may be applied to the decoupling circuit 11, a second read signal READ<1> may then be applied to the decoupling circuit 12, and a third read signal READ<2> may then be applied to the decoupling circuit 13. Some of the read signals READ<0:3> may be applied to the decoupling circuits 11 to 14 so as to overlap each other.

The respective read signals READ<0:3> may check whether or not TDDB is generated in a first capacitor (not shown) included in each of the decoupling circuits 11 to 14. The read signals READ<0:3> may be periodically generated by a predetermined period signal PTEN. For example, the respective read signals READ<0:3> may be applied to the plurality of decoupling circuits 11 to 14 sequentially or randomly for each period (d) of a predetermined temperature sensing signal, but aspects of the present disclosure are not limited thereto.

Figure 14:
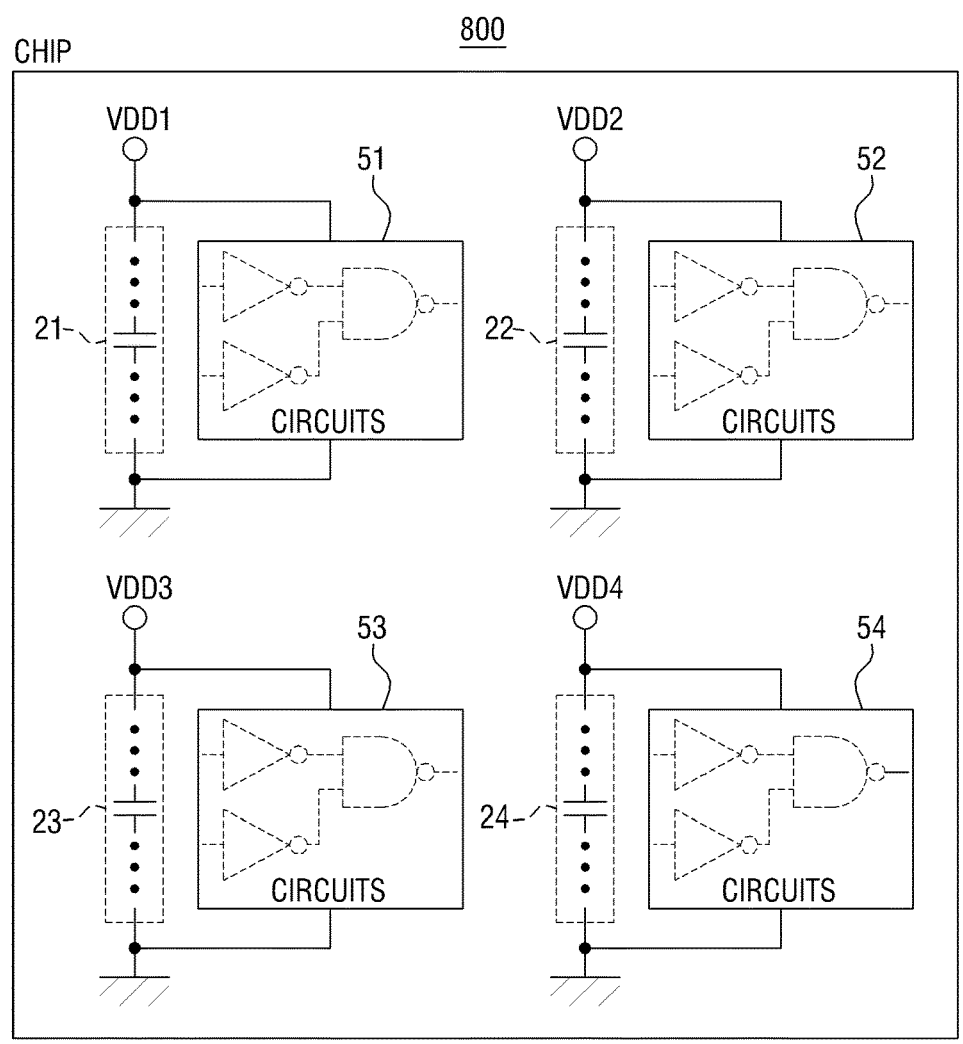
FIG. 14 is a block diagram of a semiconductor chip including decoupling circuits according to exemplary embodiments of the present disclosure.

FIG. 14 is a block diagram of a semiconductor chip including decoupling circuits according to exemplary embodiments.

Referring to FIG. 14, the semiconductor chip 800 according to exemplary embodiments of the present disclosure may include logic circuits 51 to 54 (i.e., logic circuit 51, logic circuit 52, logic circuit 53, and logic circuit 54) and decoupling circuits 21 to 24 (i.e., decoupling circuit 21, decoupling circuit 22, decoupling circuit 23, and decoupling circuit 24). In some embodiments, the semiconductor chip 800 may include a plurality of logic circuits 51 to 54 each connected between an external power voltage (each of VDD1, VDD2, VDD3, and VDD4) and a ground, and a plurality of plurality of decoupling circuits 21 to 24 connected in parallel to the plurality of logic circuits 51 to 54. The decoupling circuits 21 to 24 may be configured and may operate in substantially the same manner as one of the above-described decoupling circuits 1 to 6 according to exemplary embodiments of the present disclosure.

Accordingly, the decoupling circuits 21 to 24 connected to the semiconductor chip 800 may minimize power noise of the semiconductor chip 800 and may maximize capacitance of capacitors included in the decoupling circuits 21 to 24 within the same area. In addition, since each of the decoupling circuits 21 to 24 includes a second capacitor operating when TDDB is generated in a first capacitor, reliability of the conventional 1-stage cell type capacitors may be improved.

Figure 15:
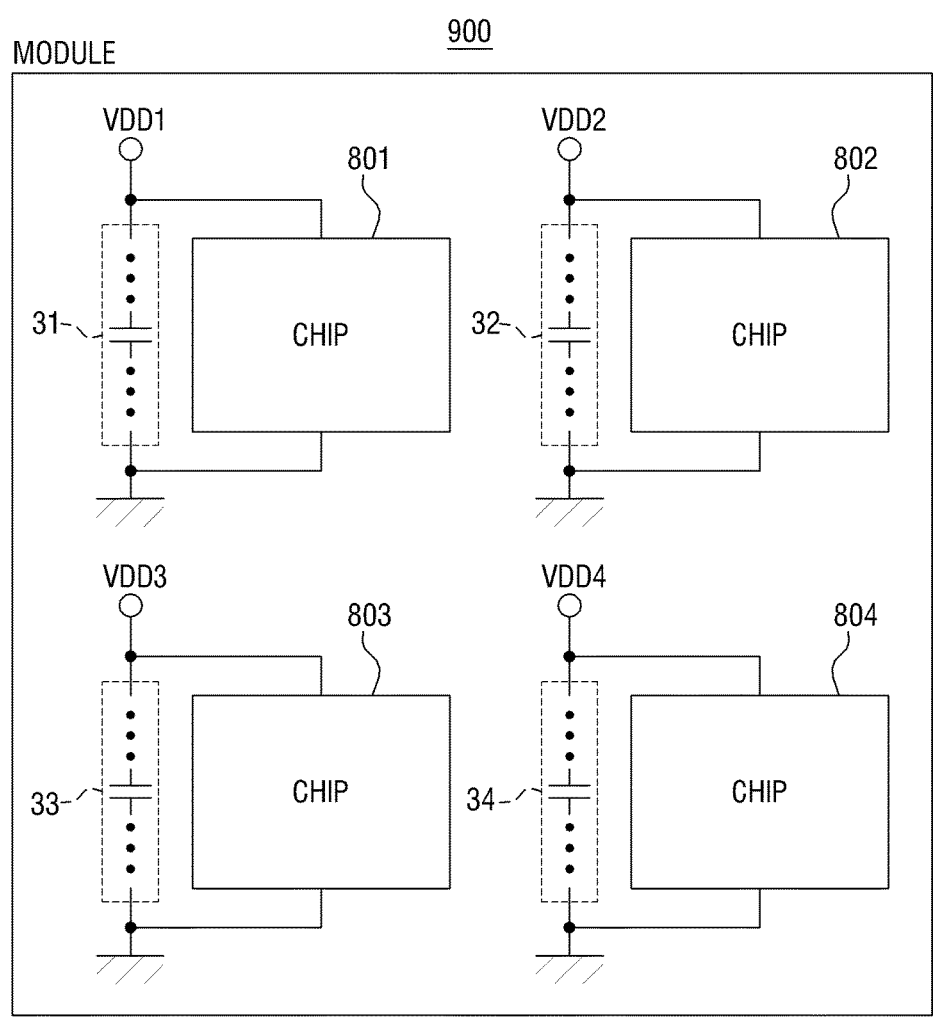
FIG. 15 is a block diagram of a semiconductor module including semiconductor chips according to exemplary embodiments.

FIG. 15 is a block diagram of a semiconductor module including semiconductor chips according to exemplary embodiments of the present disclosure.

Referring to FIG. 15, the semiconductor module 900 according to exemplary embodiments of the present disclosure includes a plurality of semiconductor chips 801 to 804 (i.e., semiconductor chip 801, semiconductor chip 802, semiconductor chip 803, and semiconductor chip 804) and a plurality of decoupling circuits 31 to 34 (i.e., decoupling circuit 31, decoupling circuit 32, decoupling circuit 33, and decoupling circuit 34). In some embodiments, the semiconductor module 900 may include a plurality of semiconductor chips 801 to 804 each connected between an external power voltage (each of VDD1, VDD2, VDD3, and VDD4) and a ground, and a plurality of decoupling circuits 31 to 34 connected in parallel to the plurality of semiconductor chips 801 to 804. The decoupling circuits 31 to 34 may be configured and may operate in substantially the same manner as one of the above-described decoupling circuits according to exemplary embodiments of the present disclosure.

Accordingly, the decoupling circuits 31 to 34 connected to the semiconductor chips 801 to 804 of the semiconductor module 900 may minimize power noise of the semiconductor chips 801 to 804 of the semiconductor module 900 and may maximize capacitance of capacitors included in the decoupling circuits 31 to 34 within the same area. In addition, since each of the decoupling circuits 31 to 34 includes a second capacitor operating when TDDB is generated in a first capacitor, reliability of conventional 1-stage cell type capacitors may be improved.

Figure 16:
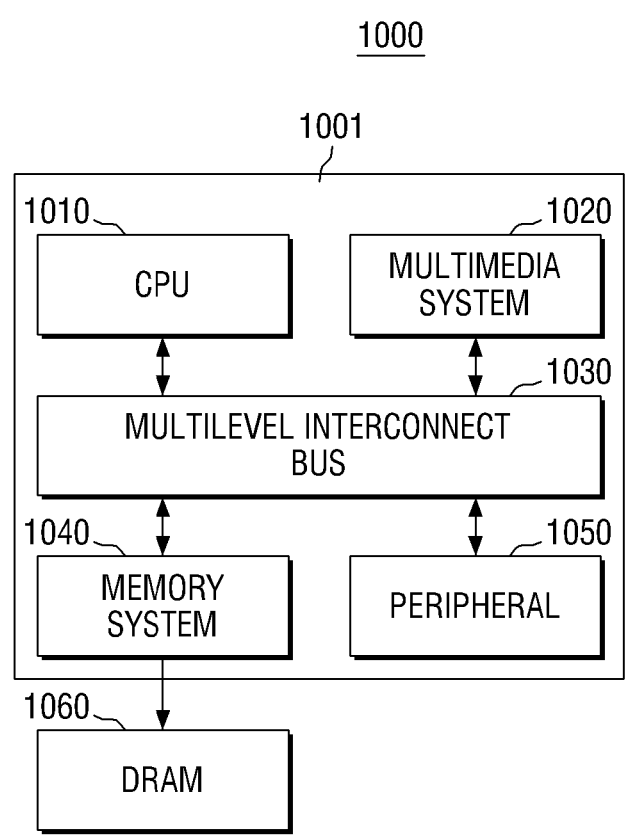
FIG. 16 is a block diagram of a system on chip (SoC) system including a semiconductor device according to exemplary embodiments.

FIG. 16 is a block diagram of a system on chip (SoC) system including a semiconductor device according to exemplary embodiments of the present disclosure.

Referring to FIG. 16, the SoC system 1000 may include an application processor 1001 and a DRAM 1060.

The application processor 1001 may include a central processing unit (CPU) 1010, a multimedia system 1020, a bus 1030 (e.g., multilevel interconnect bus), a memory system 1040, and a peripheral circuit 1050.

The CPU 1010 may execute instructions or computations to drive the SoC system 1000. In exemplary embodiments of the present disclosure, the CPU 1010 may be configured by multi-core environments including a plurality of cores.

The multimedia system 1020 may be used when the SoC system 1000 performs various multimedia functions. The multimedia system 1020 may include a 3D engine module (not shown), a video codec (not shown), a display system (not shown), a camera system (not shown), and a post-processor (not shown).

The bus 1030 may be used when the CPU 1010, the multimedia system 1020, the memory system 1040, and the peripheral circuit 1050 perform data communication with each other. In exemplary embodiments of the present disclosure, the bus 1030 may have a multi-layer structure. In some embodiments, examples of the bus 1030 may include a multi-layer advanced high-performance bus (AHB) or a multi-layer advanced eXtensible interface (AXI), but aspects of the present disclosure are not limited thereto.

The memory system 1040 may provide an environment for high-speed operation of the application processor 1001 connected to an external memory (for example, DRAM 1060). In exemplary embodiments of the present disclosure, the memory system 1040 may include a separate controller (for example, a DRAM controller) for controlling the external memory (for example, DRAM 1060).

The peripheral circuit 1050 may provide environments for the SoC system 1000 to be smoothly connected to an external device (e.g., a main board). Accordingly, the peripheral circuit 1050 may include various interfaces to be compatible with the external device connected to the SoC system 1000.

The DRAM 1060 may function as a working memory for the application processor 1001 to operate. In exemplary embodiments of the present disclosure, as shown, the DRAM 1060 may be positioned outside the application processor 1001. In some embodiments, the DRAM 1060 may be packaged with the application processor 1001 in the form of a package on package (PoP).

At least one of the components of the SoC system 1000 may employ a semiconductor module 900 including, for example, one of the decoupling capacitors 1 to 6 according to exemplary embodiments of the present disclosure.

Figure 17:
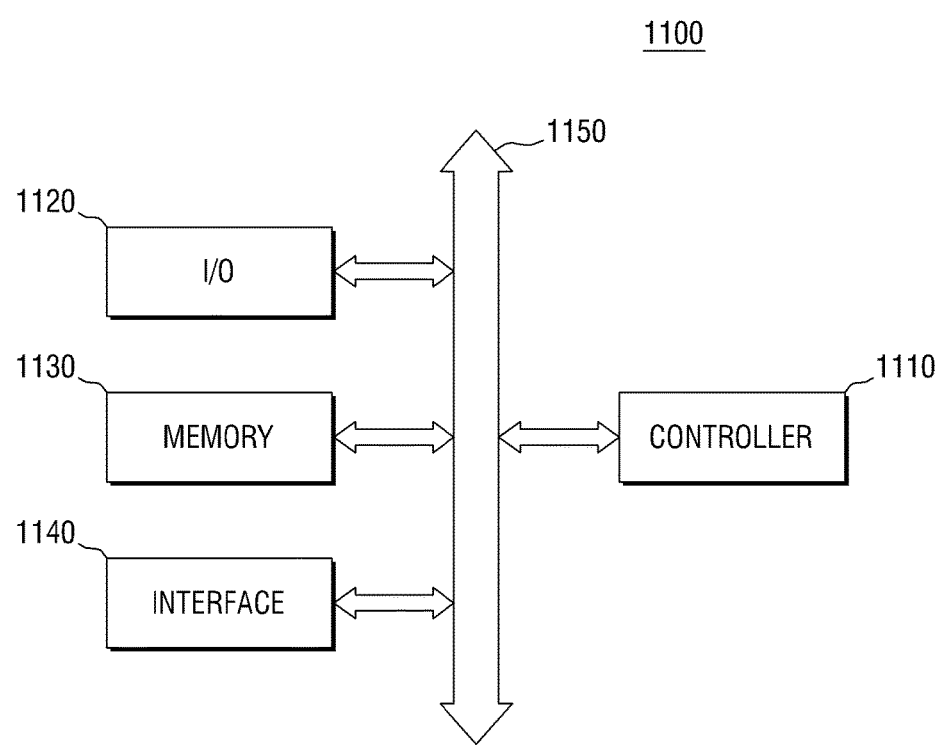
FIG. 17 is a block diagram of an electronic system including a semiconductor device according to exemplary embodiments.

FIG. 17 is a block diagram of an electronic system including a semiconductor device according to exemplary embodiments of the present disclosure.

Referring to FIG. 17, the electronic system 1100 in accordance with embodiment may include a controller 1110, an input and output (I/O) device 1120, a memory device 1130, an interface 1140, and a bus 1150. The controller 1110, the I/O 1120, the memory device 1130, and/or the interface 1140 may be connected to one another through the bus 1150. The bus 1150 may function to provide a path through which data can be transmitted/received to/from controller 1110, the I/O 1120, the memory device 1130, and/or the interface 1140.

The controller 1110 may include any logic device that can perform functions of at least one of, for example, a microprocessor, a digital signal processor, and a microcontroller, or functions similar to those. The I/O 1120 may include at least one selected from a key pad, key board, and a display device. The memory device 1130 may function to store data and/or instructions performed by the controller 1110. The interface 1140 may function to transmit/receive data to/from a communication network. The interface 1140 may include an antenna, wired or wireless transceivers or the like to transmit and receive data by wires or wirelessly.

Although not shown, the electronic system 1100 may further include high-speed DRAM and/or SRAM as a working memory for improving the operation of the controller 1110. The semiconductor module 900 including, for example, one of the decoupling capacitors 1 to 6 according to exemplary embodiments of the present disclosure may be employed as the working memory.

In addition, the semiconductor module 900 according to exemplary embodiments of the present disclosure may be provided in the memory device 1130 or may be provided as components, such as the controller 1110, the I/O 1120, or the like.

The electronic system 1100 may be embodied in any one of a personal digital assistant (PDA), a portable computer, a web tablet, a wireless phone, a mobile phone, a digital music player, a memory card, and an information transmitting/receiving system.

Figure 18:
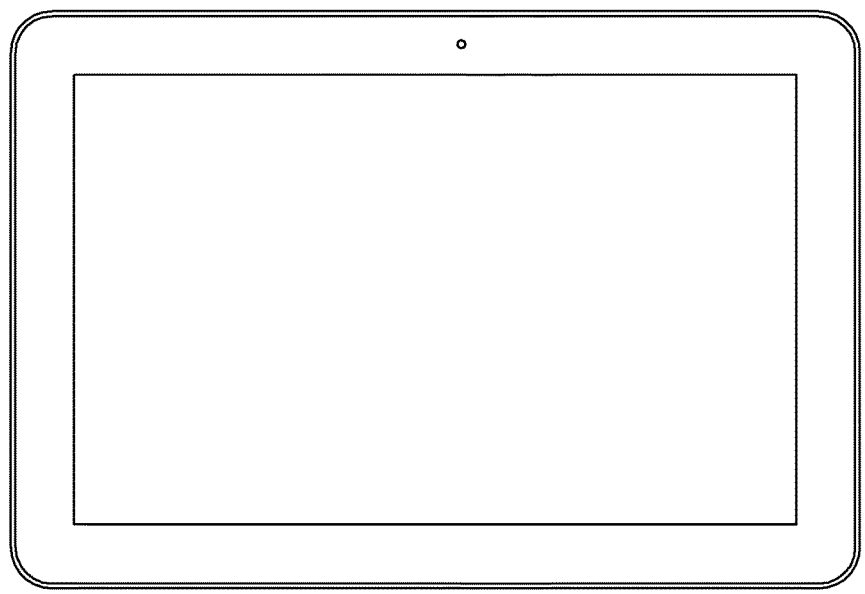
FIGS. 18 to 20 are diagrams illustrating exemplary semiconductor systems to which semiconductor devices according to exemplary embodiments.
Figure 19:
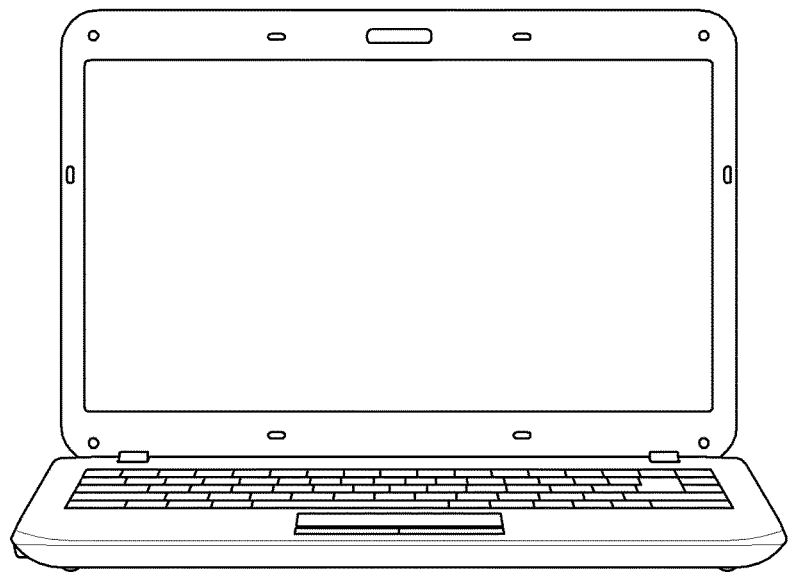
Figure 20:
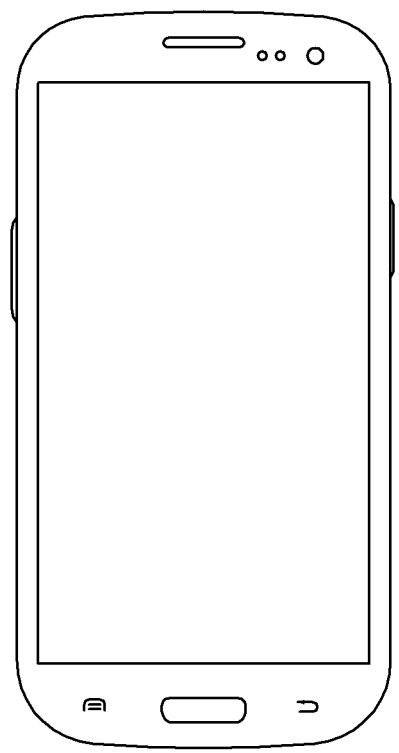

FIGS. 18 to 20 are diagrams illustrating exemplary semiconductor systems to which semiconductor devices according to exemplary embodiments of the present disclosure may be applied.

FIG. 18 illustrates an example in which a semiconductor device according to an embodiment of the present disclosure is applied to a tablet PC (1200), FIG. 19 illustrates an example in which a semiconductor device according to an embodiment of the present disclosure is applied to a notebook computer (1300), and FIG. 20 illustrates an example in which a semiconductor device according to an embodiment of the present disclosure is applied to a smart phone (1400). The semiconductor module 900 including one of the decoupling circuits 1 to 6 according to the embodiments of the present disclosure may be applied to the tablet PC 1200, the notebook computer 1100, and the smart phone 1400.

In addition, the semiconductor module 900 according to exemplary embodiments of the present disclosure may also be applied to other integrated circuit (IC) devices not illustrated herein. For example, in the above-described embodiments, only the tablet PC 1200, the notebook computer 1300 and the smart phone 1400 have been exemplified as the semiconductor systems according to the embodiments of the present disclosure, but aspects of the present disclosure are not limited thereto.

In exemplary embodiments of the present disclosure, the semiconductor system may be implemented by a computer, a ultra-mobile personal computer (UMPC), a workstation, a net-book, a personal digital assistance (PDA), a portable computer (PC), a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, and so on.

While the present disclosure has been particularly shown and described with reference to exemplary embodiments thereof, it will be understood by those of ordinary skill in the art that various changes in form and details may be made therein without departing from the spirit and scope of the present disclosure. It is therefore desired that the present embodiments be considered in all respects as illustrative and not restrictive, reference being made to the appended claims rather than the foregoing description to indicate the scope of the invention.

What is claimed is:

1. A decoupling circuit comprising:
 a first circuit including a first capacitor having a first end connected to a first terminal, a first switch device connected between a second end of the first capacitor and a second terminal, and a first control device configured to receive a voltage level of the second end of the first capacitor and turn on/off the first switch device based on the voltage level of the second end of the first capacitor; and
 a second circuit including a second capacitor having a first end connected to the first terminal, a second switch device connected between a second end of the second capacitor and the second terminal, and a second control device configured to turn on/off the second switch device based on a voltage level of the second end of the second capacitor and an output signal of the first control device.

2. The decoupling circuit of claim 1, wherein each of the first switch device and the second switch device includes a p-channel metal oxide semiconductor (PMOS) transistor, each of the first control device and the second control device includes a NAND gate, and the first control device receives an enable signal.

3. The decoupling circuit of claim 2, wherein if a time dependent dielectric breakdown (TDDB) is generated in the first capacitor, an output signal of the first control device is enabled and the second control device turns on the second switch device.

4. The decoupling circuit of claim 2, wherein if a time dependent dielectric breakdown (TDDB) is generated in the first capacitor, a resistance of the first capacitor is smaller than that of the first switch device and a second voltage level of the second end of the first capacitor becomes lower than a first voltage level of the second end of the first capacitor before the TDDB is generated in the first capacitor.

5. The decoupling circuit of claim 2, wherein the first terminal is a ground voltage (VSS) and the second terminal is an external power voltage (VDD).

6. A decoupling circuit comprising:
a first circuit including a first capacitor and a first control device configured to turn on/off the first capacitor; and
a second circuit including a second capacitor and a second control device configured to turn on/off the second capacitor,
wherein if a time dependent dielectric breakdown (TDDB) is generated in the first capacitor, the first control device turns off the first capacitor and transfers a first signal for turning on the second capacitor to the second control device.

7. The decoupling circuit of claim 6, wherein each of the first control device and the second control device includes a NAND gate and the first control device receives an enable signal as an input.

8. The decoupling circuit of claim 7, wherein the first control device controls the first switch device based on a voltage level of a first end of the first capacitor, and if the TDDB is generated in the first capacitor, the voltage level of the first end of the first capacitor is decreased and a voltage level of a first end of the second capacitor is increased.

9. A decoupling circuit comprising:
a first circuit including a first capacitor having a first end connected to a first terminal, a first switch device connected between a second end of the first capacitor and a second terminal, and a first control device configured to turn on/off the first switch device based on a voltage level of the second end of the first capacitor; and
a second circuit including a second capacitor having a first end connected to the first terminal, a second switch device connected between a second end of the second capacitor and the second terminal, and a second control device configured to turn on/off the second switch device based on a voltage level of the second end of the second capacitor and an output signal of the first control device,
wherein each of the first switch device and the second switch device includes a p-channel metal oxide semiconductor (PMOS) transistor, each of the first control device and the second control device includes a NAND gate, and the first control device receives an enable signal.

10. The decoupling circuit of claim 9, wherein if a time dependent dielectric breakdown (TDDB) is generated in the first capacitor, an output signal of the first control device is enabled and the second control device turns on the second switch device.

11. The decoupling circuit of claim 9, wherein if a time dependent dielectric breakdown (TDDB) is generated in the first capacitor, a resistance of the first capacitor is smaller than that of the first switch device and a second voltage level of the second end of the first capacitor becomes lower than a first voltage level of the second end of the first capacitor before the TDDB is generated in the first capacitor.

12. The decoupling circuit of claim 9, wherein the first terminal is a ground voltage (VSS) and the second terminal is an external power voltage (VDD).

* * * * *